United States Patent
Kumar et al.

(10) Patent No.: US 7,641,811 B2
(45) Date of Patent: *Jan. 5, 2010

(54) ENHANCED THERMAL CONDUCTING FORMULATIONS

(75) Inventors: Rajneesh Kumar, Poughkeepsie, NY (US); Stephen P. Ostrander, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/196,443

(22) Filed: Aug. 22, 2008

(65) Prior Publication Data

US 2008/0311381 A1  Dec. 18, 2008

Related U.S. Application Data

(63) Continuation of application No. 11/739,701, filed on Apr. 25, 2007, now Pat. No. 7,462,294.

(51) Int. Cl.
*C09K 5/08* (2006.01)
*C09K 5/10* (2006.01)
*C09K 5/14* (2006.01)
*H01B 1/00* (2006.01)
*H05K 7/20* (2006.01)

(52) U.S. Cl. .............. 252/70; 252/71; 165/104.15; 165/104.19; 257/E23.075; 257/E23.077; 257/E23.107; 361/688; 361/699; 361/704; 427/58

(58) Field of Classification Search ............... 252/70, 252/71; 165/104.15, 104.19; 257/E23.075, 257/E23.077, E23.107; 361/688, 699, 704; 427/58
See application file for complete search history.

(56) References Cited

U.S. PATENT DOCUMENTS

| | | |
|---|---|---|
| 3,778,287 A | 12/1973 | Stansfield et al. |
| 5,011,870 A | 4/1991 | Peterson |
| 5,094,769 A | 3/1992 | Anderson, Jr. et al. |
| 5,098,609 A | 3/1992 | Iruvanti et al. |
| 5,177,667 A | 1/1993 | Graham et al. |
| 5,213,704 A | 5/1993 | Anderson, Jr. et al. |
| 5,294,830 A | 3/1994 | Young et al. |
| 5,591,789 A | 1/1997 | Iruvanti et al. |
| 6,096,414 A | 8/2000 | Young |
| 6,169,142 B1 | 1/2001 | Nakano et al. |
| 6,284,817 B1 | 9/2001 | Cross et al. |
| 6,380,301 B1 | 4/2002 | Enami et al. |
| 6,515,061 B1 | 2/2003 | Iruvanti et al. |
| 6,656,389 B2 | 12/2003 | Iruvanti et al. |
| 6,791,839 B2 | 9/2004 | Bhagwagar |
| 6,797,758 B2 | 9/2004 | Misra et al. |
| 6,899,160 B2 | 5/2005 | McCullough |
| 7,094,822 B2 | 8/2006 | Sagal et al. |
| 7,324,343 B2 | 1/2008 | Takahahsi |
| 7,329,706 B2 | 2/2008 | Fukui et al. |
| 7,462,294 B2 * | 12/2008 | Kumar et al. ............. 252/70 |
| 2002/0010245 A1 | 1/2002 | Enami et al. |
| 2003/0044631 A1 | 3/2003 | Sagal et al. |
| 2003/0234074 A1 | 12/2003 | Bhagwagar |
| 2005/0205989 A1 | 9/2005 | Shibuya et al. |
| 2006/0014915 A1 | 1/2006 | Ahn et al. |
| 2006/0228542 A1 | 10/2006 | Czubarow |
| 2007/0097651 A1 | 5/2007 | Canale et al. |
| 2007/0161517 A1 | 7/2007 | Cheng et al. |
| 2007/0179223 A1 | 8/2007 | Hiroshige et al. |

OTHER PUBLICATIONS

Derwent-Acc-No. 2007-715669, abstract of Korean Patent Specification No. KR 2007034157A (Mar. 28, 2007).
Derwent-Acc-No. 2008-A80704, abstract of Chinese Patent Specification No. CN 1982404A (Jun. 20, 2007).

\* cited by examiner

*Primary Examiner*—Anthony J Green
(74) *Attorney, Agent, or Firm*—DeLio & Peterson, LLC; Kelly M. Nowak; Joseph Petrokaitis

(57) ABSTRACT

A thermal conducting mixture is provided which is used to make thermal conducting formulations such as a paste having a high thermal conductivity and a relatively low viscosity. The paste is used to provide a thermal conductor connection between an electronic component and a cooling device to increase the heat transfer rate between the component and the device cooling the electronic component. The formulation contains the mixture of thermally conductive particles in various particle size ranges typically dispersed in a non-aqueous dielectric carrier containing an antioxidant and a dispersant with the thermally conductive particles mixture being specially correlated in the mixture by volume % based on particle size range and by particle size ratio of each particle size range. The mixture may be used to make other similar products such as thermal gels, adhesives, slurries and composites, for electronic and cosmetics, pharmaceuticals, automotive, and like products.

17 Claims, No Drawings

ENHANCED THERMAL CONDUCTING FORMULATIONS

This is a continuation of application Ser. No. 11/739,107, filed on Apr. 25, 2007, now issued as U.S. Pat. No. 7,462,294.

BACKGROUND OF THE INVENTION

1. Field of the Invention

The present invention relates to high thermal conducting mixtures which are used to make high thermal conducting mixes which are used to make high thermal conducting formulations, one formulation of which has particular use as a heat transfer means for cooling electronic components such as VLSI chips.

2. Description of Related Art

Electronic devices and components generate heat and in many applications the heat needs to be effectively dissipated for the device to function. In one example, integrated circuit chips which are mounted in an array on substrates need to achieve greater computer speeds and the miniaturization of electronic devices has resulted in components which generate more heat and which require denser packing of the active components of the electronic device. The use of such components and denser packing is only practicable, however, when the heat generated is effectively removed from the active components and a number of techniques have been developed to cool such electronic components.

Liquid coolants are commonly employed in such high density cooling applications and various systems have been disclosed in the art for providing a separate cooling member to cool the component. Fins, channels, baffles, and other heat exchanger type devices have been developed to remove heat from the electronic component. Exemplary apparatus for cooling integrated circuit chips are shown in U.S. Pat. Nos. 5,177,667 and 5,294,830, the disclosures of both patents being herein incorporated by reference.

In most of these cooling devices there is an air space between the electronic component to be cooled and the cooling device which air space has a relatively low heat transfer rate. To overcome this problem, thermal compounds or formulations commonly referred to as thermal greases or pastes, gels, adhesives, and composites have been developed to enhance the transfer of heat from the electronic component to the cooling device by contacting and connecting both surfaces and providing a high heat transfer conducting means. The following description will be directed to thermal pastes for electronic cooling devices although the invention is applicable to make other products such as cosmetic, pharmaceutical, and automotive products.

The thermal compound must have high thermal conductivity and preferably be an electrical insulator. The compound must also have a low viscosity and be compliant so that the thermal compound can be easily applied to the surfaces of the electronic component to be cooled and can conform with the microscopically rough surface of the electronic component which are often bowed or tilted to minimize air gaps which are detrimental to the cooling process. Low viscosity is also important because the electronic components and the solid bonds that attach the components to a substrate are fragile and the force needed to apply the thermal compound must be minimal.

A number of thermal compounds have been developed to be used in electronic systems and, in general, the thermal compound comprises thermally conductive particles in a curable or non-curable liquid dielectric medium along with other components such as dispersants, antioxidants, and stabilizers.

U.S. Pat. Nos. 5,094,769 and 5,213,704 provide a phase-stable, thermally conductive paste having a relatively constant thermal conductivity and viscosity for transferring heat from electronic components. A critical component of the paste is the use of a coupling agent such as an organosilane which has a functionality which is reactive with the thermally conductive particles and a functionality which is of similar polarity to the liquid carrier. The disclosures of these patents are hereby incorporated by reference.

In U.S. Pat. No. 5,098,609 stable high solids, high thermal conductivity pastes are disclosed which contain a stabilizing dispersant to inhibit liquid-solids separation and which facilitate incorporation of more thermally conductive solids into the paste. Examples of stabilizing dispersants are monomeric acids; monomeric, oligomeric and/or polymeric fatty acid esters and salts thereof; petroleum sulfonates; and polyimides. Polyesters as disclosed in U.S. Pat. No. 3,778,287 to Stansfield and Hypermers made by ICI are disclosed in the patent as being useful as the stabilizing dispersant. The disclosures of both patents are hereby incorporated by reference.

Increasing demands of industry however, are requiring thermal compounds having improved thermal conductivity in order to be used with the new computers and other electronic components now being developed. In general, higher thermal conductive material loadings are needed for higher thermal conductivity compounds and while compounds having thermal conductivities ranging from 1-6 W/mK (watts/meter-degree K) are commercially available, the pastes tend to be too thick and stiff at the high solid loadings required for thermal conductivities greater than 3 W/mK. Hard, non-compliant and difficult to dispense pastes cannot be used for most applications.

SUMMARY OF THE INVENTION

Bearing in mind the problems and deficiencies of the prior art, it is therefore an object of the present invention to provide a thermally conductive mixture which may be used to make thermal compounds such as pastes having a wide range of thermal conducting material loading levels necessary to provide a wide range of thermal conductivity properties of about 5-9 W/mK and above, with relatively low viscosity, phase stability and thermal reliability. A highly desirable thermal paste made using the mixture herein has a thermal conductivity of 5-9 W/mK and above and a viscosity of 50 to 500 Pa-sec. measured at 110° C.

It is another object of the present invention to provide a method for cooling an electronic component comprising the use of a specially formulated thermally conductive paste made using the thermally conductive mixture of the invention to provide a thermal transfer means between the electronic component and the cooling mechanism.

It is another object of the present invention to provide a thermal conductor mixture which may not only be used for making thermal pastes for electronic uses, but thermal adhesives, gels, slurries and composites.

Still other objects and advantages of the invention will in part be obvious and will in part be apparent from the specification.

The aforementioned objects and advantages are achieved in the present invention which relates in one aspect to a thermal conducting filler mixture having a high thermal conductivity useful for making thermal conductive products comprising:

a first thermal conductor material having a particle size range of about 5 to 20, preferably 10 to 15 microns in an amount of about 30 to 70 volume %, preferably 53 to 58 volume %;

a second thermal conductor material having a particle size range of about 0.5 to 10, preferably 3.0 to 7.5 microns in an amount of about 5 to 35 volume %, preferably 18 to 23 volume %; and a third thermal conductor material having a particle size range of about 0.05 to 2, preferably 0.3 to 0.5 micron in an amount of about 10 to 50 volume %, preferably 21 to 26 volume %;

wherein the first thermal conductor material, second thermal conductor material and third thermal conductor materials are present in the mixture in particle volume ratios of:

first conductor material to second conductor material of about 1:2 to 10:1, preferably 1:1 to 6:1 and most preferably 1.2:1 to 5:1;

first conductor material to third conductor material of about 1:4 to 6:1, preferably 1:1 to 4:1 and most preferably 1:1 to 3.2:1; and second conductor material to third conductor material of about 1:4 to 7:2, preferably 1:4 to 1.5:1 and most preferably 1:4 to 1.2:1.

In another aspect of the invention the above mixture is used to make a thermal paste comprising greater than or equal to about 80% by weight of the mixture and the balance antioxidant, dispersant and/or liquid carrier and preferably about 90 to 96% by weight of the mixture and an organic mix of antioxidant, dispersant and/or liquid carrier less than or equal to 20% by weight and preferably about 4 to 10 weight %.

In a further aspect of the invention a thermal conducting filler mix useful for making a thermal conductive product comprises:

a first thermal conductor material having a particle size of about 5 to 20 microns, preferably 10 to 15 microns in an amount of about 45 to 95 volume %, preferably 70 to 75 volume %; and a second thermal conductor material having a particle size of about 0.05 to 2 microns, preferably 0.3 to 0.5 microns in an amount of about 5 to 55 volume %, preferably 25 to 30 volume %;

wherein the first thermal conductor material and the second thermal conductor material are present in the mixture in a particle volume ratio of:

first conductor material to second conductor material of about 1:2 to 4:1, preferably 1:1 to 3:1 and most preferably 1:1 to 2.3:1.

In another aspect of the invention the above mixture is used to make a thermal paste comprising greater than or equal to about 80% by weight of the mixture and the balance antioxidant, dispersant and/or liquid carrier and preferably about 90 to 95% by weight of the mixture and an organic mix of antioxidant, dispersant and/or liquid carrier less than or equal to 20% by weight and preferably about 5 to 10 weight %.

In another aspect of the invention, a method is provided for cooling an electronic component comprising:

providing an electronic component to be cooled;

providing a cooling means surface proximate to the electronic component; and applying a layer of a thermally conductive paste of the invention to the electronic component surface and to the cooling means surface to provide a thermal paste connection between the electronic component and the cooling surface.

DESCRIPTION OF THE PREFERRED EMBODIMENT(S)

The thermal conductor material particles which may be used in the invention may be selected from a wide variety of materials which exhibit a relatively high thermal conductivity such as boron nitride, vanadium boride, aluminum and aluminum oxide. The preferred shape is spherical or cubic so that packing density is maximized while providing a low viscosity of the dispersion of particles in a liquid carrier such as the liquid dielectric carrier used to make a thermal paste for electronics fabrication. Other shaped materials such as platelets may be used. Exemplary metal particles which may be used in the invention include, aluminum, silicon, copper, and silver. Ceramic materials such as silicon carbide, aluminum nitride, boron nitride, vanadium boride, diamond, aluminum oxide, zinc oxide, magnesium oxide, and silicon dioxide may be employed. Aluminum and aluminum oxide are preferred because of their demonstrated effectiveness, availability and cost effectiveness.

A mixture of materials of different particle size distribution is important to achieve the high thermal conductivity and suitable viscosities of thermal pastes of the invention.

The thermally conductive particles are preferably treated before they are dispersed in the liquid carrier so that their surface is modified. The particles may be modified by heat treating such as calcining in air in order to remove low surface energy organic contaminants absorbed from the ambient.

Mixtures of thermal conductive materials may also be utilized to provide a paste having certain features depending upon the application.

It is important that the amounts of each thermal material in the mixture and the particle size of each of the thermally conductive materials used in the mixture be controlled as described herein.

The thermally conductive material particle mixture in the paste composition will generally be, in weight %, in an amount greater than 90%, usually about 90 to 96%, preferably, 92 to 95%.

A dispersant material is used in the paste composition to avoid phase separation of the paste.

A liquid carrier, typically an oil and a solvent cleanable dielectric fluid such as a saturated poly(alpha olefin) is typically used to provide a paste composition which is mobile and compliant.

It would also be advantageous to incorporate an antioxidant in the paste composition so that any exposure of the compound to oxygen or other oxidizing agents will not cause a chemical change causing phase separation.

Other materials may be utilized in the paste composition as known in the art to provide particular desired effects. Thus, the stability of the paste composition may be enhanced by the addition of chemically inert particles of high surface area to resist phase separation by absorbing excess liquid carrier in those situations where the electronic component power cycling leads to thermal/mechanical stressing of the paste composition and a propensity for the paste composition to bleed. Fumed silica or other such particles may be incorporated in the composition to increase the capacity of the paste composition to avoid irreversible bleeding. As discussed in U.S. Pat. No. 5,094,769 supra, the addition of a polymer such as polyisobutylene to a paste composition enhances the shear stability of the composition.

The paste compositions are of low enough viscosity to be mobile during modular assembly to follow the surface contour of the electronic component but viscous enough so as to be stable mechanically when applied in small gaps to form the heat conductor path especially when exposed to power fluctuations. In state of the art semiconductor components, these gaps may be as low as 10 mils or less to minimize the length of the thermal path. This small gap causes high shear forces to be applied to the thermal compound which adds to the stability problem. To satisfy these criteria as well as accomplishing all of the other advantages provided by the thermally conductive pastes of the present invention, it is preferred that the paste composition comprise about 90% to 96% by weight thermal conductive particles, and the balance being the dispersant, antioxidant and liquid carrier. It is desired that the pastes have a thermal conductivity above about 5-10 W/mK, preferably above about 6 W/mK, with a viscosity at 110° C. of about 50 to 500 Pa-sec. Preferred paste viscosities at 110° C. are below about 500 Pa-sec, preferably about 80 to 280 Pa-sec and most preferably about 110 Pa-sec.

The paste compositions of the present invention may be made by any means known to those skilled in the art. Generally, the dispersant and liquid carrier are blended and then the thermally conductive solid mixture is added gradually with continual stirring. Other additives may now be added. This mixture of solids and liquids is then milled using known techniques (e.g., roll mill) to produce a homogeneous paste.

The following examples describe the manner and process of making and using the invention and set forth the best mode contemplated by the inventors for carrying out the invention, but are not to be construed as limiting.

Example

Comparative thermal paste compositions were prepared to show the importance of controlling the amount of the thermal conductive materials and their particle size ratio to each other in the thermal conductive mixture and the use of the mixture to make a thermal paste formulation. Each formulation contained as the balance Irganox antioxidant, PA0 6 and PA0 8 as the carrier oils and 12 hydroxy stearic acid ester as the dispersant.

Thus, having described the invention, what is claimed is:

1. A thermal conducting filler mixture having a high thermal conductivity useful for making thermal conductive products comprising:
    a first thermal conductor material having a particle size range of about 5 to 20 microns in an amount of about 30 to 70 volume %;
    a second thermal conductor material having a particle size range of about 0.5 to 10 microns in an amount of about 5 to 35 volume %; and
    a third thermal conductor material having a particle size range of about 0.05 to 2 micron in an amount of about 10 to 50 volume %;
    wherein the first thermal conductor material, second thermal conductor material and third thermal conductor materials are present in the mixture in particle volume ratios of:
    first conductor material to second conductor material of about 1:2 to 10:1;
    first conductor material to third conductor material of about 1:4 to 6:1; and
    second conductor material to third conductor material of about 1:4 to 7:2.

2. The thermal conducting filler mixture of claim 1 wherein the particle volume ratios are as follows:
    first conductor material to second conductor material of about 1:1 to 6:1;
    first conductor material to third conductor material of about 1:1 to 4:1; and
    second conductor material to third conductor material of about 1:4 to 1.5:1.

3. The thermal conducting filler mixture of claim 2 wherein the particle volume ratios are as follows:
    first conductor material to second conductor material of about 1.2:1 to 5:1;
    first conductor material to third conductor material of about 1:1 to 3.2:1; and

TABLE

| Example # | Weight % Filler Particles | Volume % Individual Filler Particles w.r.t. Total Fillers Filler Type | | | Volume Ratios | | | Viscosity @ 110° C., Pa · sec | Thermal Conductivity, W/m-K |
|---|---|---|---|---|---|---|---|---|---|
| | | (1) Aluminum 10-15 | (2) Aluminum 3.0-7.5 | (3) Alumina 0.3-0.5 | (1)/(2) | (1)/(3) | (2)/(3) | | |
| 1 | 92.2 | 57 | 23 | 20 | 2.5 | 2.9 | 1.2 | 150 | 7.1 |
| 2 | 92.7 | 57 | 16 | 26 | 3.5 | 2.2 | 0.6 | 80 | 6.8 |
| 3 | 92.8 | 64 | 16 | 20 | 3.9 | 3.2 | 0.8 | 90 | 6.3 |
| 4 | 93.6 | 51 | 10 | 39 | 5.1 | 1.3 | 0.3 | 200 | 6.2 |
| 5 | 93.6 | 55 | 20 | 25 | 2.7 | 2.2 | 0.8 | 115 | 8.0 |
| 6 | 93.9 | 38 | 29 | 33 | 1.3 | 1.2 | 0.9 | 70 | 6.2 |
| 7 | 94.2 | 55 | 20 | 25 | 2.8 | 2.2 | 0.8 | 260 | 8.7 |
| 8 | 92.8 | 70 | — | 30 | — | 2.3 | — | 100 | 7.0 |
| 9 | 92.9 | 56 | — | 44 | — | 1.3 | — | 360 | 6.0 |

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

second conductor material to third conductor material of about 1:4 to 1.2:1.

4. The thermal conducting filler mixture of claim 3 wherein the first thermal conductor material is in an amount of about 53 to 58 volume %; the second thermal conductor mixture is in an amount of about 18 to 23% volume %; and the third conductor material is in an amount of about 21 to 26 volume %.

5. The thermal conducting filler mixture of claim 1 in an amount of about 90-96% by weight in combination with about 4-10 weight % of an organic mix of antioxidant, dispersant, and liquid carrier to form a thermal paste.

6. The thermal paste of claim 5 conducting filler mixture of claim 2 wherein the thermal conducting filler mixture is a thermal paste.

7. The thermal conducting filler mixture of claim 3 wherein the thermal conducting filler mixture is a thermal paste.

8. The thermal conducting filler mixture of claim 4 wherein the thermal conducting filler mixture is a thermal paste.

9. A thermal conducting filler mix useful for making a thermal conductive products comprises:
   a first thermal conductor material having a particle size of about 5 to 20 microns in an amount of about 45 to 95 volume %; and
   a second thermal conductor material having a particle size of about 0.05 to 2 microns in an amount of about 5 to 55 volume %;
   wherein the first thermal conductor material and the second thermal conductor material are in the mixture in a particle volume ratio of:
   first conductor material to second conductor material of about 1:2 to 4:1,
   wherein said thermal conducting filler mix together with an organic mix of antioxidant, dispersant, and liquid carrier forms a thermal paste comprising about 90-95 weight % of said thermal conducting filler mix and the balance being said organic mix, said thermal paste having a thermal conductivity above about 5-10 W/mK with a viscosity at 110° C. of about 50 to 500 Pa-sec.

10. The thermal conducting filler mix of claim 9 wherein the particle volume ratio of the first conductor material to the second conductor material is about 1:1 to 3:1.

11. The thermal conducting filler mix of claim 10 wherein the particle volume ratio of the first conductor material to the second conductor material is about 1:1 to 2.3:1.

12. The thermal conducting filler mix of claim 11 wherein the first conductor material is in an amount of about 70-75 volume % and the second thermal conductor material is present in an amount of about 25-30 volume %.

13. The thermal conducting filler mix of claim 10 wherein the thermal conducting filler mix is a thermal paste.

14. The thermal conducting filler mix of claim 11 wherein the thermal conducting filler mix is a thermal paste.

15. The thermal conducting filler mix of claim 12 wherein the thermal conducting filler mix is a thermal paste.

16. A method for cooling an electronic component comprising:
   providing an electronic component to be cooled;
   providing a cooling means surface proximate to an electronic component; and
   applying a layer of the thermal conducting filler mixture of claim 1 to a surface of the electronic component and to the cooling means surface to provide a thermal connection between the electronic component and the cooling means surface.

17. The method of claim 16 wherein the thermal conducting filler mixture is a thermal paste.

* * * * *